United States Patent
Ikeda et al.

(10) Patent No.: US 9,520,272 B2
(45) Date of Patent: Dec. 13, 2016

(54) MICROWAVE EMISSION MECHANISM, MICROWAVE PLASMA SOURCE AND SURFACE WAVE PLASMA PROCESSING APPARATUS

(71) Applicant: TOKYO ELECTRON LIMITED, Tokyo (JP)

(72) Inventors: Taro Ikeda, Yamanashi (JP); Hiroyuki Miyashita, Yamanashi (JP); Yuki Osada, Yamanashi (JP); Yutaka Fujino, Yamanashi (JP); Tomohito Komatsu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 120 days.

(21) Appl. No.: 14/373,589

(22) PCT Filed: Dec. 14, 2012

(86) PCT No.: PCT/JP2012/082496
§ 371 (c)(1),
(2) Date: Jul. 21, 2014

(87) PCT Pub. No.: WO2013/111474
PCT Pub. Date: Aug. 1, 2013

(65) Prior Publication Data
US 2014/0361684 A1   Dec. 11, 2014

(30) Foreign Application Priority Data

Jan. 27, 2012  (JP) .................................. 2012-015092
Sep. 18, 2012  (JP) .................................. 2012-204568

(51) Int. Cl.
*H01Q 1/26*   (2006.01)
*H01J 37/32*  (2006.01)
*H05H 1/46*   (2006.01)

(52) U.S. Cl.
CPC ...... *H01J 37/32266* (2013.01); *H01J 37/3222* (2013.01); *H01J 37/32201* (2013.01);
(Continued)

(58) Field of Classification Search
CPC ................ H05H 1/46; H05H 2001/463; H05H 2001/4615; H05H 2001/4622; H05H 1/00; H01J 65/044; H01J 37/3211; H01J 37/3222
(Continued)

(56) References Cited

U.S. PATENT DOCUMENTS 5,389,153 A * 2/1995 Paranjpe ........... H01J 37/32229
                                              118/723 IR
6,399,520 B1    6/2002 Kawakami et al.
2009/0159214 A1* 6/2009 Kasai ................ H01J 37/32192
                                              156/345.41

FOREIGN PATENT DOCUMENTS

JP   2000-294550    10/2000
WO   2008013112 A1   1/2008

OTHER PUBLICATIONS

International Search Report; International Application No. PCT/JP2012/082496; Mar. 19, 2013.
(Continued)

*Primary Examiner* — Alexander H Taningco
*Assistant Examiner* — Christian L Garcia

(57) ABSTRACT

A microwave emission mechanism includes: a transmission path through which a microwave is transmitted; and an antenna section that emits into a chamber the microwave transmitted through the transmission path. The antenna section includes an antenna having a slot through which the microwave is emitted, a dielectric member through which the microwave emitted from the antenna is transmitted and a closed circuit in which a surface current and a displacement current flow. A surface wave is formed in a surface of (Continued)

the dielectric member. The closed circuit has at least: an inner wall of the slot; and the surface and an inner portion of the dielectric member. When a wavelength of the microwave is $\lambda_0$, a length of the closed circuit is $n\lambda_0 \pm \delta$, where n is a positive integer and $\delta$ is a fine-tuning component including 0.

15 Claims, 8 Drawing Sheets

(52) U.S. Cl.
CPC ......... *H01J 37/32229* (2013.01); *H05H 1/46* (2013.01); *H01J 37/32192* (2013.01); *H05H 2001/463* (2013.01); *H05H 2001/4615* (2013.01); *H05H 2001/4622* (2013.01)

(58) Field of Classification Search
USPC ............................... 315/34, 39, 3.5; 313/157
See application file for complete search history.

(56) References Cited

OTHER PUBLICATIONS

Abstract for JP 2000-294550; http://www.19.ipd.inpit.go.jp; Oct. 10, 2000.
Abstract for WO 2008-013112; http://worldwide.espacenet.com; Jan. 31, 2008.

* cited by examiner

MICROWAVE EMISSION MECHANISM, MICROWAVE PLASMA SOURCE AND SURFACE WAVE PLASMA PROCESSING APPARATUS

FIELD OF THE INVENTION

The present invention relates to a microwave emission mechanism, a microwave plasma source and a surface wave plasma processing apparatus.

BACKGROUND OF THE INVENTION

Plasma processing is a necessary technology in manufacturing a semiconductor device. Along with the recent demand for high integration and high speed of an LSI (Large Scale Integration), a design rule of the semiconductor device forming the LSI requires miniaturization and a semiconductor wafer becomes scaled up. Accordingly, a plasma processing apparatus is required to respond to such miniaturization and scaling up.

However, in a parallel plate type plasma processing apparatus or an inductively coupled plasma processing apparatus which has been conventionally used, an electron temperature of a generated plasma is high, so that plasma damage is inflicted on a micro-device. Further, since a high-density plasma region is locally distributed, it is difficult to uniformly perform plasma processing on a scaled-up semiconductor wafer at a high speed.

Therefore, a RLSA (Radial Line Slot Antenna) microwave plasma processing apparatus capable of uniformly generating a surface wave plasma with a high density and a low electron temperature has attracted attention (see, e.g., Patent Document 1).

In the RLSA microwave plasma processing apparatus, a radial line slot antenna as a planar slot antenna having a plurality of slots formed in a predetermined pattern is provided, as a surface wave plasma generating antenna, at an upper portion of a chamber, and a microwave guided from a microwave generation source is emitted through the slots of the antenna, and radiated into the chamber maintained in a vacuum state through a dielectric microwave transmission plate provided under the antenna. Then, a surface wave plasma is generated in the chamber by the microwave electric field to process an object such as a semiconductor wafer or the like.

Further, there is suggested a plasma processing apparatus including a plurality of microwave emission mechanisms, each having the above-described planar slot antenna, wherein a microwave is divided into a plurality of microwaves and the microwaves emitted from the microwave emission mechanisms are guided into the chamber and spatially combined in the chamber, thereby generating a plasma (see Patent Document 2).

PATENT DOCUMENT

Patent Document 1: Japanese Patent Application Publication No. 2000-294550
Patent Document 2: PCT Patent Publication No. WO2008/013112

However, it has been found that in the plasma processing apparatus for generating a surface wave plasma by emitting microwaves, an increasing rate of a plasma density (electron density) is decreased as an input power is increased. In other words, it has been found that even if the input power is increased so as to increase the plasma density (electron density), the electron density is not sufficiently increased.

SUMMARY OF THE INVENTION

In view of the above, the present invention provides a microwave emission mechanism, a microwave plasma source and a surface wave plasma processing apparatus which can increase an increasing rate of a plasma density (electron density) as an input power is increased.

In accordance with a first aspect of the present invention, there is provided a microwave emission mechanism for emitting into a chamber a microwave generated by a microwave generation mechanism, in a plasma processing apparatus for performing plasma processing by generating a surface wave plasma in the chamber, the microwave emission mechanism including: a transmission path through which the microwave is transmitted, the transmission path including a cylindrical outer conductor and an inner conductor coaxially disposed within the outer conductor; and an antenna section configured to emit into the chamber the microwave transmitted through the transmission path, wherein the antenna section includes: an antenna having a slot through which the microwave is emitted; a dielectric member through which the microwave emitted from the antenna is transmitted, a surface wave being formed on a surface of the dielectric member; and a closed circuit in which a surface current and a displacement current flow, the closed circuit having at least an inner wall of the slot and the surface and an inner portion of the dielectric member, and wherein when a wavelength of the microwave is $\lambda_0$, a length of the closed circuit is $n\lambda_0 \pm \delta$, where n is a positive integer and $\delta$ is a fine-tuning component including 0.

In this case, a thickness of the slot may be determined such that the length of the closed circuit becomes $n\lambda_0 \pm \delta$. Further, the slot may be filled with a dielectric material. Further, a thickness of the slot may be set to be relatively thick while setting a thickness of the dielectric member to be relatively thin such that the length of the closed circuit becomes $n\lambda_0 \pm \delta$.

In accordance with a second aspect of the present invention, there is provided a microwave plasma source, including: a microwave generation mechanism configured to generate a microwave; and a microwave emission mechanism configured to emit the generated microwave into a chamber, wherein the microwave is emitted into the chamber to generate a surface wave plasma of a gas supplied into the chamber, wherein the microwave emission mechanism includes: a transmission path through which the microwave is transmitted, the transmission path including a cylindrical outer conductor and an inner conductor coaxially disposed within the outer conductor; and an antenna section configured to emit into the chamber the microwave transmitted through the transmission path, wherein the antenna section includes: an antenna having a slot through which the microwave is emitted; a dielectric member through which the microwave emitted from the antenna is transmitted, a surface wave being formed on a surface of the dielectric member; and a closed circuit in which a surface current and a displacement current flow, the closed circuit having at least an inner wall of the slot and the surface and an inner portion of the dielectric member, and wherein when a wavelength of the microwave is $\lambda_0$, a length of the closed circuit is $n\lambda_0 \pm \delta$, where n is a positive integer and $\delta$ is a fine-tuning component including 0.

In accordance with a third aspect of the present invention, there is provided a surface wave plasma processing apparatus, including: a chamber configured to accommodate a substrate to be processed; a gas supply unit configured to supply a gas into the chamber; and a microwave plasma source configured to emit a microwave into the chamber to generate a surface wave plasma of the gas supplied into the chamber, the microwave plasma source including a microwave generation mechanism for generating the microwave and a microwave emission mechanism for emitting the generated microwave into the chamber, wherein the substrate in the chamber is processed by the surface wave plasma, wherein the microwave emission mechanism includes: a transmission path through which the microwave is transmitted, the transmission path including a cylindrical outer conductor and an inner conductor coaxially disposed within the outer conductor; and an antenna section configured to emit into the chamber the microwave transmitted through the transmission path, wherein the antenna section includes: an antenna having a slot through which the microwave is emitted; a dielectric member through which the microwave emitted from the antenna is transmitted, a surface wave being formed on a surface of the dielectric member; and a closed circuit in which a surface current and a displacement current flow, the closed circuit having at least an inner wall of the slot and the surface and an inner portion of the dielectric member, and wherein when a wavelength of the microwave is $\lambda_0$, a length of the closed circuit is $n\lambda_0 \pm \delta$, where n is a positive integer and $\delta$ is a fine-tuning component including 0.

The microwave plasma source of the second aspect and the surface wave plasma processing apparatus of the third aspect may include a plurality of microwave emission mechanisms.

DETAILED DESCRIPTION OF THE EMBODIMENTS

Hereinafter, embodiments of the present invention will be described in detail with reference to the accompanying drawings.

(Configuration of Surface Wave Plasma Processing Apparatus)

Figure 1:
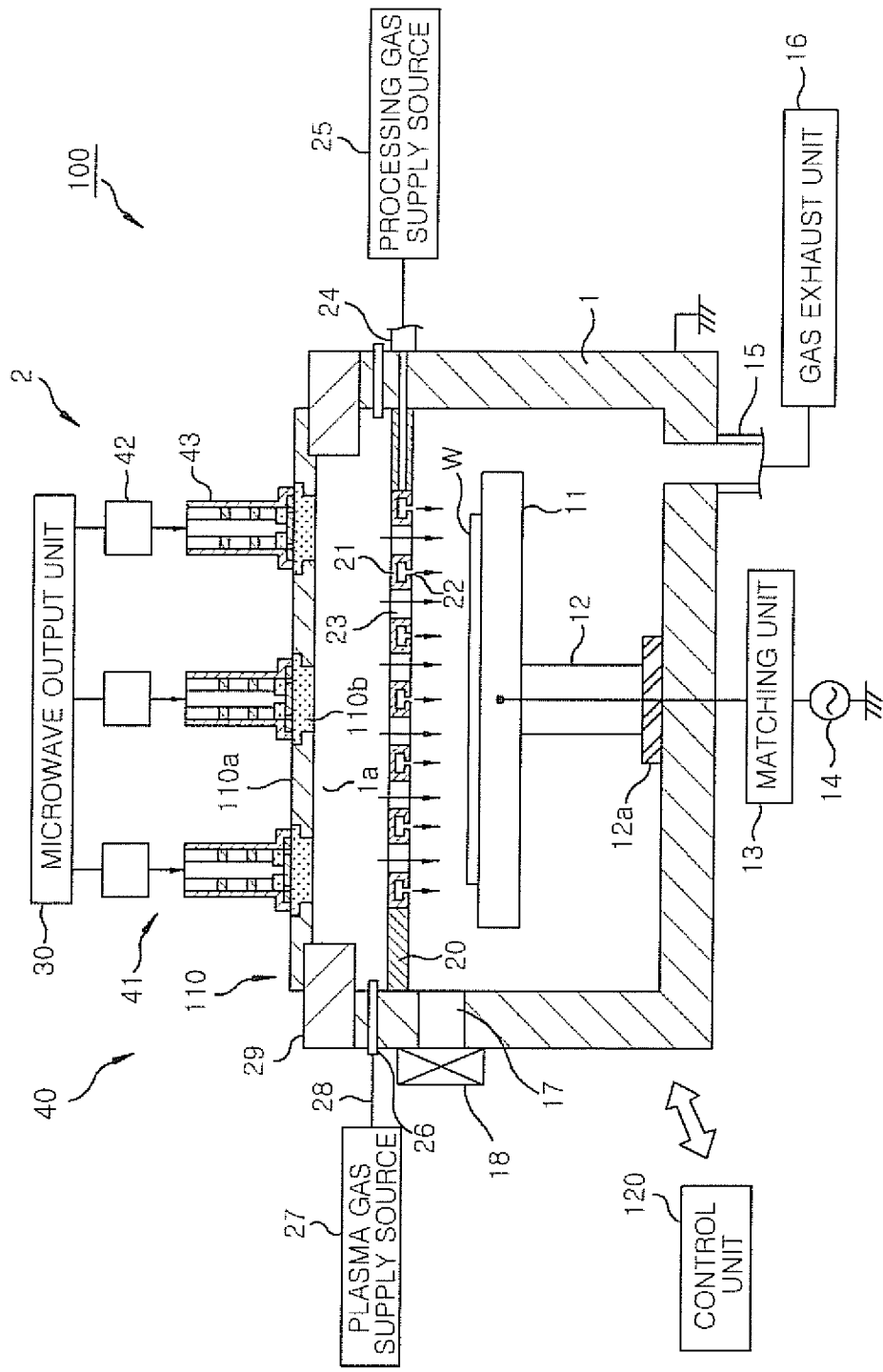
FIG. 1 is a cross sectional view showing a schematic configuration of a surface wave plasma processing apparatus including a microwave emission mechanism in accordance with an embodiment of the present invention.
Figure 2:
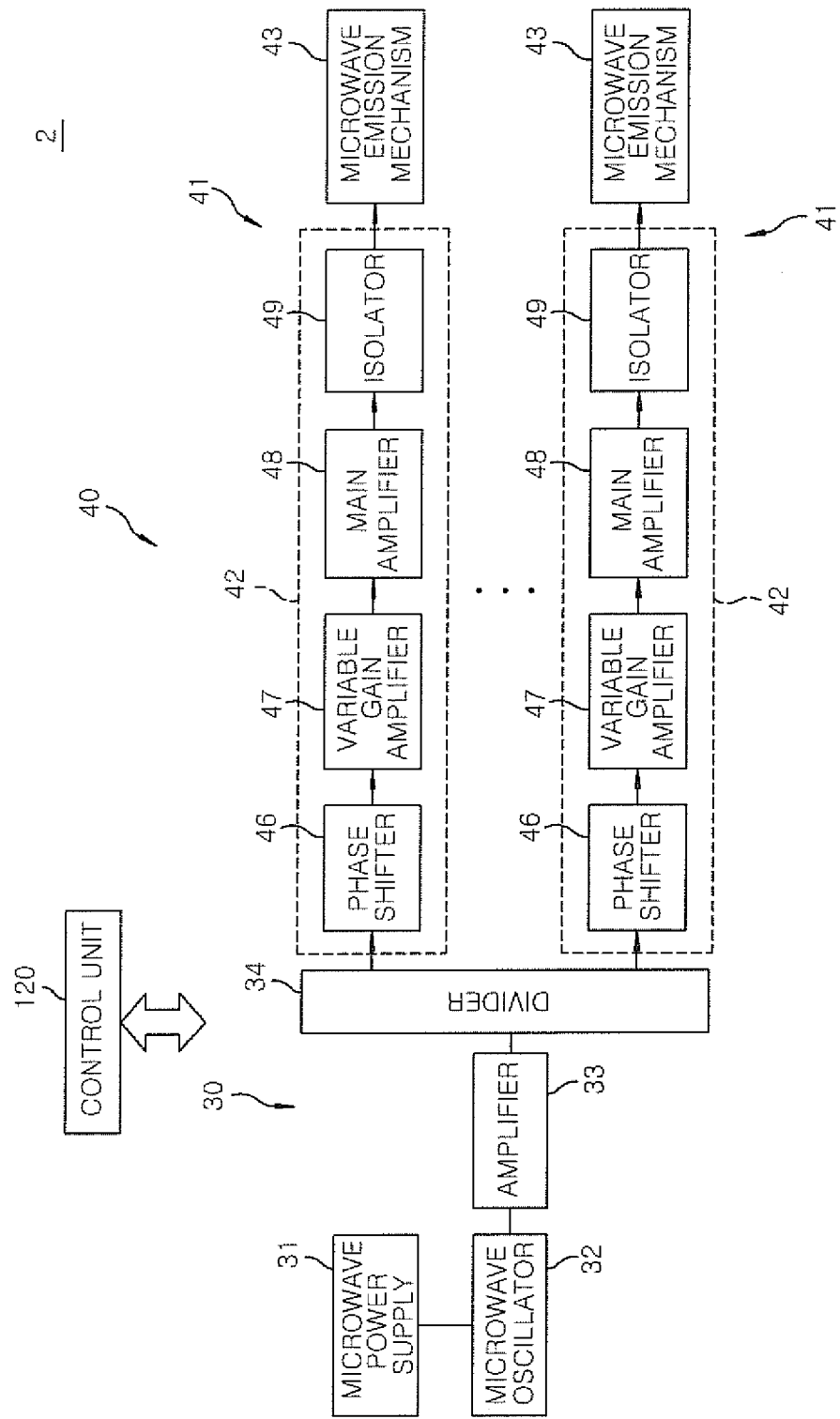
FIG. 2 shows a configuration of a microwave plasma source for use in the surface wave plasma processing apparatus shown in FIG. 1.
Figure 3:
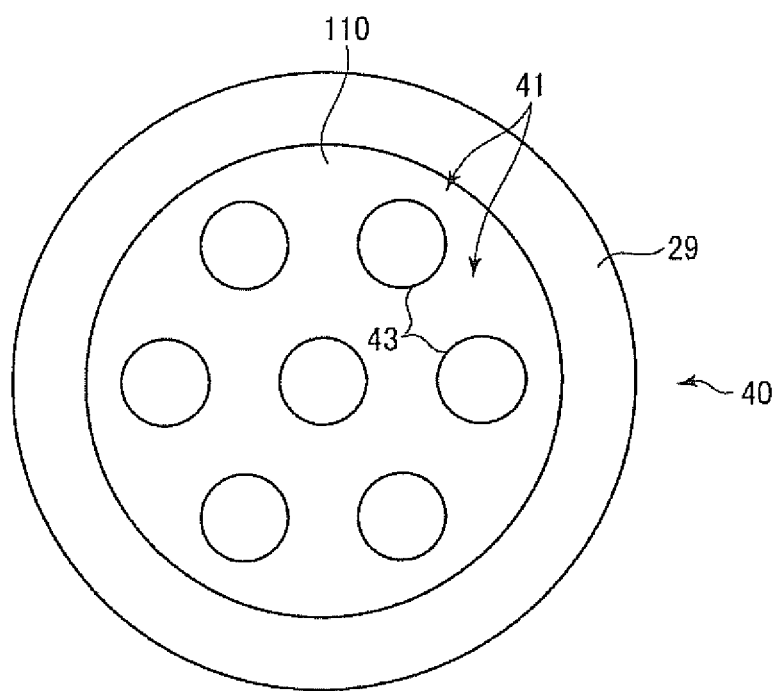
FIG. 3 is a top view schematically showing a microwave supply unit in the microwave plasma source.

FIG. 1 is a cross sectional view showing a schematic configuration of a surface wave plasma processing apparatus including a microwave emission mechanism in accordance with an embodiment of the present invention. FIG. 2 shows a configuration of a microwave plasma source for use in the surface wave plasma processing apparatus shown in FIG. 1. FIG. 3 is a top view schematically showing a microwave supply unit in the microwave plasma source.

The surface wave plasma processing apparatus 100 is configured as a plasma etching apparatus for performing a plasma process, e.g., an etching process, on a wafer. The surface wave plasma processing apparatus 100 includes: a substantially cylindrical airtight chamber 1 which is grounded and made of a metallic material such as aluminum, stainless steel or the like; and a microwave plasma source 2 for generating a microwave plasma in the chamber 1. An opening 1a is formed at a top portion of the chamber 1, and the microwave plasma source 2 is provided to face the inside of the chamber 1 through the opening 1a.

In the chamber 1, a susceptor 11 for horizontally supporting a semiconductor wafer W that is an object to be processed (hereinafter, referred to as "wafer") is supported by a cylindrical supporting member 12 which is vertically installed at a center of a bottom portion of the chamber 1 via an insulating member 12a. The susceptor 11 and the supporting member 12 are made of, e.g., aluminum having an alumite-treated (anodically oxidized) surface or the like.

Although it is not illustrated, the susceptor 11 has an electrostatic chuck for electrostatically attracting the wafer W, a temperature control mechanism, a gas channel for supplying a heat transfer gas to a backside of the wafer w, elevating pins that are moved up and down to transfer the wafer W and the like. Further, a high frequency bias power supply 14 is electrically connected to the susceptor 11 via a matching unit 13. By supplying a high frequency power from the high frequency bias power supply 14 to the susceptor 11, ions in the plasma are attracted to the wafer W.

A gas exhaust line 15 is connected to the bottom portion of the chamber 1, and a gas exhaust unit 16 having a vacuum pump is connected to the gas exhaust line 15. By operating the gas exhaust unit 16, the inside of the chamber 1 can be exhausted and depressurized to a predetermined vacuum level at a high speed. Provided at a sidewall of the chamber 1 are a loading/unloading port 17 for loading and unloading the wafer W, and a gate valve 18 for opening and closing the loading/unloading port 17.

A shower plate 20 through which a processing gas for plasma etching is injected toward the wafer W is horizontally provided above the susceptor 11 in the chamber 1. The shower plate 20 includes gas channels 21 arranged in a grid pattern and a plurality of gas injection holes 22 formed in the gas channels 21. Spaces 23 are formed between the gas channels 21. A line 24 extending to the outside of the chamber 1 is connected to the gas channels 21 of the shower plate 20, and a processing gas supply source 25 is connected to the line 24.

Meanwhile, a ring-shaped plasma gas introducing member 26 is provided along a chamber wall above the shower plate 20 in the chamber 1, and a plurality of gas injection holes is formed in an inner circumference of the plasma gas introducing member 26. A plasma gas supply source 27 for supplying a plasma gas is connected to the plasma gas introducing member 26 via a line 28. As for a plasma generating gas, Ar gas or the like is preferably used. As for the processing gas, it is possible to use a general etching gas, e.g., $Cl_2$ gas or the like.

The plasma gas introduced into the chamber 1 through the plasma gas introducing member 26 is turned into a plasma by microwaves supplied from the microwave plasma source 2 into the chamber 1. The generated plasma passes through the spaces 23 of the shower plate 20 and excites the processing gas injected through the gas injection holes 22 of the shower plate 20. Accordingly, a plasma of the processing gas is generated. The plasma gas and the processing gas may be supplied from the same supply member.

The microwave plasma source 2 has a ceiling plate 110 supported by a support ring 29 provided at an upper portion of the chamber 1, and a gap between the support ring 29 and the ceiling plate 110 is airtightly sealed. As shown in FIG. 2, the microwave plasma source 2 includes a microwave output unit 30 for dividing and outputting the microwave to a plurality of channels, and a microwave supply unit 40 for transmitting and emitting into the chamber 1 the microwaves outputted from the microwave output unit 30.

The microwave output unit 30 includes a microwave power supply 31, a microwave oscillator 32, an amplifier 33 for amplifying an oscillated microwave, and a divider 34 for dividing the amplified microwave into a plurality of microwaves.

The microwave oscillator 32 oscillates a microwave at a predetermined frequency (e.g., 915 MHz) by using PLL (phase-locked loop). The divider 34 divides the microwave amplified by the amplifier 33 while matching an impedance between an input side and an output side to minimize loss of the microwave. The frequency of the microwave may be 700 MHz to 3 GHz as well as 915 MHz.

The microwave supply unit 40 includes a plurality of antenna modules 41 for guiding the microwaves divided by the divider 34 into the chamber 1. Each of the antenna modules 41 includes an amplifier unit 42 for mainly amplifying the divided microwave and a microwave emission mechanism 43. The microwave emission mechanism 43 has a tuner 60 for matching an impedance and an antenna section 45 for emitting the amplified microwave into the chamber 1. The microwave is emitted into the chamber 1 from the antenna section 45 of the microwave emission mechanism 43 in each of the antenna modules 41. As shown in FIG. 3, the microwave supply unit 40 has seven antenna modules 41, and the microwave emission mechanisms 43 of the seven antenna modules 41 are arranged on the circular ceiling plate 110, wherein one microwave emission mechanism 43 is disposed at a center of the ceiling plate 110 and six microwave emission mechanisms 43 are disposed along a circumference of the ceiling plate 110.

The ceiling plate 110 serves as a vacuum seal and a microwave transmission plate. The ceiling plate 110 includes a metallic frame 110a and dielectric members 110b made of a dielectric material such as quartz or the like. The dielectric members 110b are provided to the frame 110a so as to correspond to the portions where the microwave emission mechanisms 43 are provided.

The amplifier unit 42 has a phase shifter 46, a variable gain amplifier 47, a main amplifier 48 constituting a solid state amplifier, and an isolator 49.

The phase shifter 46 is configured to shift the phase of the microwave, and the radiation characteristics can be modulated by controlling the phase shifter 45. For example, the directivity can be controlled by adjusting the phase in each of the antenna modules to thereby change the plasma distribution. Further, circularly polarized waves can be obtained by shifting the phase by 90° between adjacent antenna modules. The phase shifter 46 can be used to control delay characteristics between components in the amplifier and perform spatial combination in the tuner. However, the phase shifter 45 may not be provided when it is unnecessary to modulate the radiation characteristics or to control the delay characteristics between the components in the amplifier.

The variable gain amplifier 47 controls a power level of the microwave to be inputted to the main amplifier 48 and adjusts a plasma intensity. By controlling the variable gain amplifier 47 for each of the antenna modules, it is possible to adjust the distribution of the generated plasma.

The main amplifier 48 constituting the solid state amplifier may have, e.g., an input matching circuit, a semiconductor amplifying apparatus, an output matching circuit, and a high Q resonant circuit.

The isolator 49 separates a reflected microwave which is reflected by the antenna section 45 toward the main amplifier 48. The isolator 49 has a circulator and a dummy load (coaxial terminator). The circulator guides the microwave reflected by the antenna section 45 to the dummy load, and the dummy load converts the reflected microwave guided by the circulator into a heat.

Figure 4:
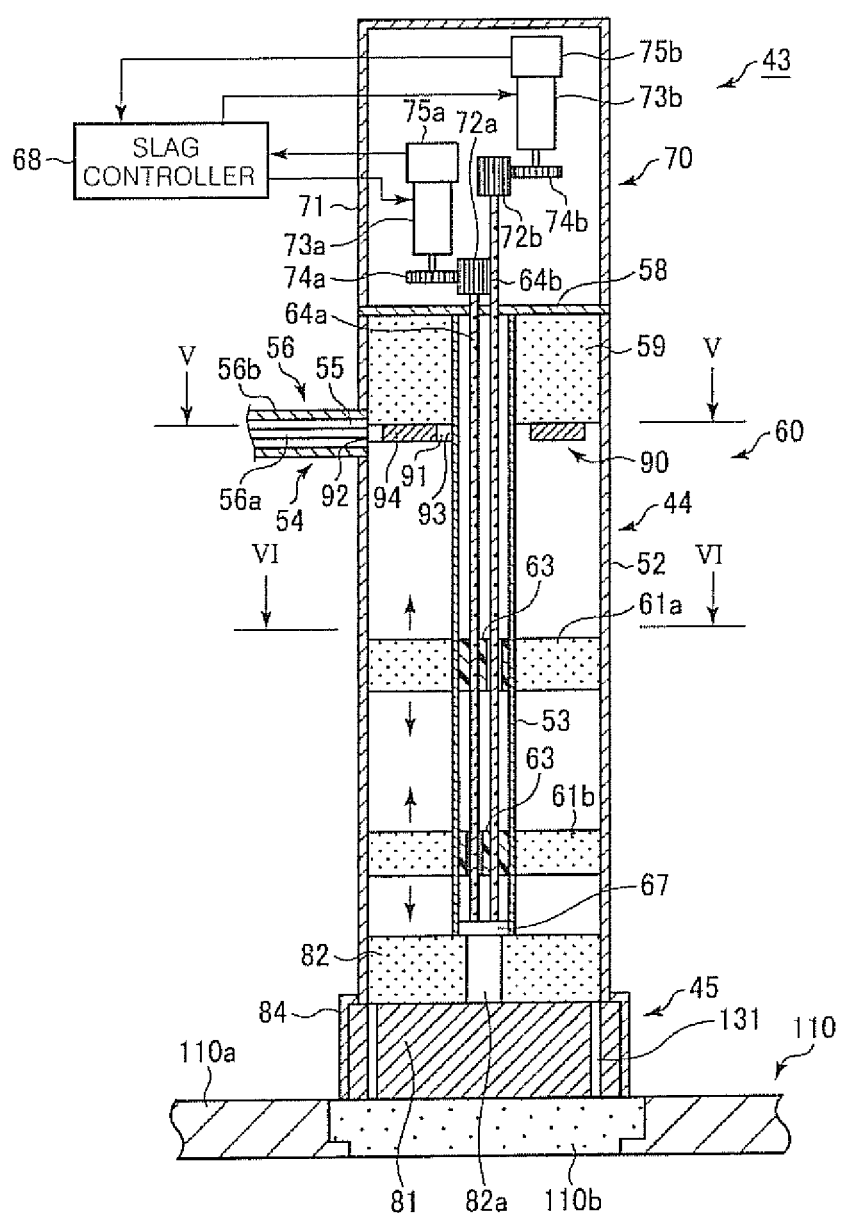
FIG. 4 is a vertical cross sectional view showing a microwave emission mechanism for use in the surface wave plasma processing apparatus shown in FIG. 1.
Figure 5:
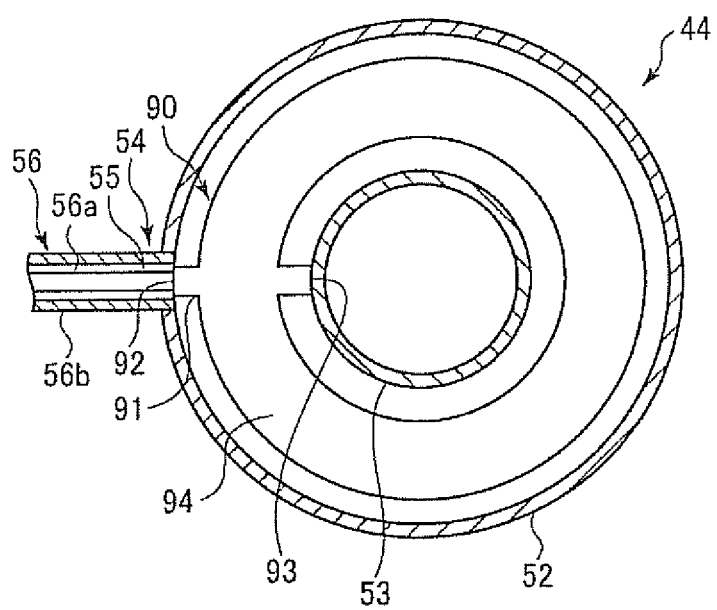
FIG. 5 is a horizontal cross sectional view showing a power supply mechanism of the microwave emission mechanism which is taken along a line V-V of FIG. 4.
Figure 6:
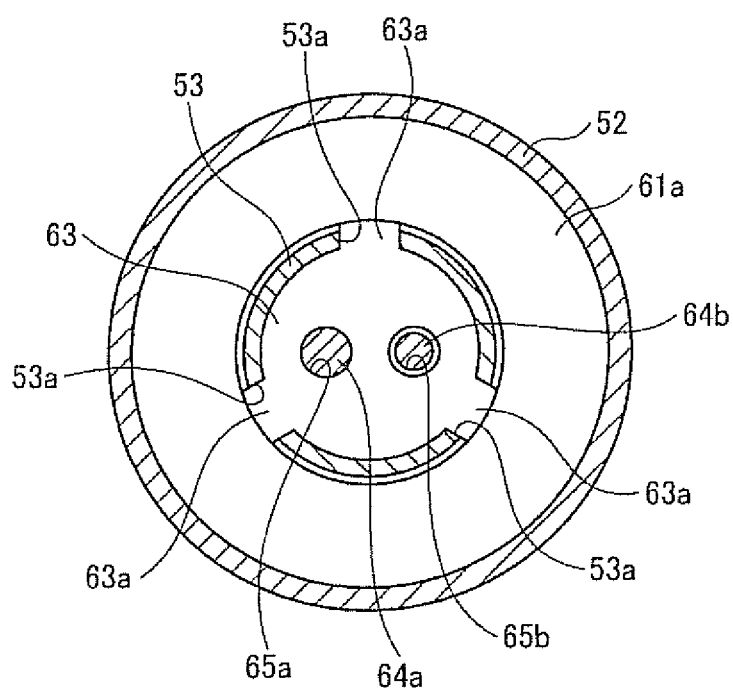
FIG. 6 is a horizontal cross sectional view showing a slag and a sliding member in a tuner which is taken along a line VI-VI of FIG. 4.
Figure 7:
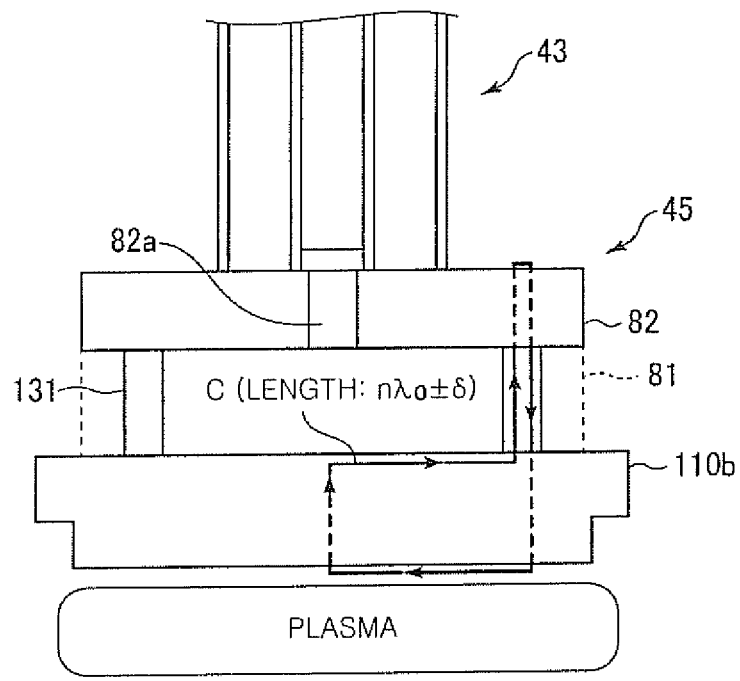
FIG. 7 is a diagram for explaining a closed circuit in which a surface current and a displacement current flow in an antenna section.
Figure 8:
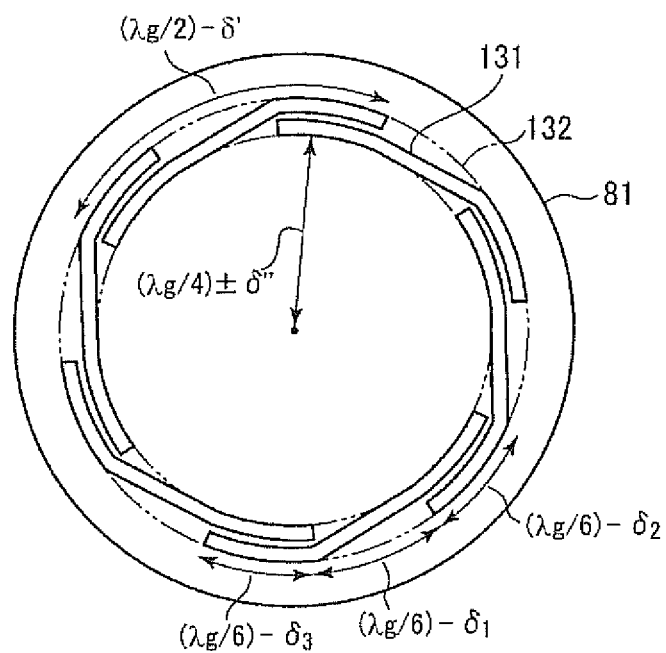
FIG. 8 is a top view showing an exemplary shape of slots of a planar slot antenna.

Hereinafter, the microwave emission mechanism 43 will be described with reference to FIGS. 4 to 8. FIG. 4 is a cross sectional view showing the microwave emission mechanism 43. FIG. 5 is a horizontal cross sectional view showing a power supply mechanism of the microwave emission mechanism 43 which is taken along a line V-V of FIG. 4. FIG. 6 is a horizontal cross sectional view showing a slag and a sliding member in the tuner 60 of the microwave emission mechanism 43 which is taken along a line VI-VI of FIG. 4. FIG. 7 is a diagram for explaining a closed circuit in which a surface current and a displacement current flow in an antenna section. FIG. 8 is a top view showing an exemplary shape of a slot of a planar slot antenna.

As shown in FIG. 4, the microwave emission mechanism 43 includes a coaxial waveguide (microwave transmission line) 44 for transmitting the microwave, and the antenna section for emitting, into the chamber 1, the microwave transmitted through the waveguide 44. The microwaves emitted from the microwave emission mechanisms 43 into the chamber 1 are combined in the space of the chamber 1 to thereby generate a surface wave plasma in the chamber 1.

The waveguide 44 includes a cylindrical outer conductor 52 and a rod-shaped inner conductor 53 coaxially arranged within the outer conductor 52. The antenna section 45 is provided at a leading end of the waveguide 44. In the waveguide 44, the inner conductor 53 is used for power supply, and the outer conductor 52 is used for a ground. A reflecting plate 58 is provided at upper ends of the outer conductor 52 and the inner conductor 53.

A power supply mechanism 54 for supplying a microwave (electromagnetic wave) is provided at a base end portion of the waveguide 44. The power supply mechanism 54 includes a microwave power introduction port 55 provided at a side surface of the waveguide 44 (the outer conductor 52) to introduce a microwave power. Connected to the microwave power introduction port 55 is a coaxial cable 56 which includes an inner conductor 56a and an outer conductor 56b and serves as a power supply line for supplying the microwave amplified by the amplifier unit 42. A power supply antenna 9D extending horizontally into the inside of the outer conductor 52 is connected to a leading end of the inner conductor 56a of the coaxial cable 56.

The power supply antenna 90 is formed by cutting a metal plate made of, e.g., aluminum or the like, and fitting the metal plate into a frame of a dielectric member made of Teflon (Registered Trademark) or the like. A wave retardation member 59 made of a dielectric material such as Teflon (Registered Trademark) is provided between the reflecting plate 58 and the power supply antenna 90 in order to shorten an effective wavelength of a reflected wave. In the case of using a microwave having a high frequency of, e.g., 2.45 GHz, the wave retardation member 59 may not be provided. At this time, a maximum electromagnetic wave is transmitted into the coaxial waveguide 44 by optimizing a distance from the power supply antenna 90 to the reflecting plate 58 and reflecting the electromagnetic wave emitted from the power supply antenna 90 by the reflecting plate 58.

As shown in FIG. 5, the power supply antenna 90 includes: an antenna main body 91 having a first pole 92 which is connected to the inner conductor 56a of the coaxial cable 56 in the microwave power introduction port 55 and through which an electromagnetic wave is supplied and a second pole 93 for emitting the supplied electromagnetic wave; and a ring-shaped reflection portion 94 extending from both sides of the antenna main body 91 along the outer surface of the inner conductor 53. A standing wave is formed by the electromagnetic wave incident on the antenna main body 91 and the electromagnetic wave reflected by the reflection portion 94. The second pole 93 of the antenna main body 91 is brought into contact with the inner conductor 53.

By emitting a microwave (electromagnetic wave) from the power supply antenna 90, a microwave power is supplied to a space between the outer conductor 52 and the inner conductor 53. The microwave power supplied to the power supply mechanism 54 propagates toward the antenna section 45.

A tuner 60 is provided in the waveguide 44. The tuner 60 matches an impedance of a load (plasma) in the chamber 1 to a characteristic impedance of the microwave power supply 31 in the microwave output unit 30. The tuner 60 includes two slags 61a and 61b which are vertically movable between the outer conductor 52 and the inner conductor 53, and a slag driving unit 70 provided at an outer side (upper side) of the reflecting plate 58.

Among the slags, the slag 61a is provided closer to the slag driving unit 70 than the slag 61b, and the slag 61b is provided closer to the antenna section 45 than the slag 61a. Two slag moving shafts 64a and 64b, which are used for moving the slags and each of which is formed of a screw rod having, e.g., a trapezoidal thread, are provided in the inner space of the inner conductor 53 along the longitudinal direction.

As shown in FIG. 6, the slag 61a is made of a dielectric material and has a circular ring shape. A sliding member 63 made of a resin having slidable property is inserted in the slag 61a. The sliding member 63 has a screw hole 65a to which the slag moving shaft 64a is screw-coupled, and a through hole 65b through which the slag moving shaft 64b is inserted. Although the slag 61b has a screw hole 65a and a through hole 65b as in the case of the slag 61a, the screw hole 65a is screw-coupled to the slag moving shaft 64b and the slag moving shaft 64a is inserted through the through hole 65b unlike the case of the slag 61a. Accordingly, the slag 61a is vertically moved by rotating the slag moving shaft 64a, and the slag 61b is vertically moved by rotating the slag moving shaft 64b. In other words, the slags 61a and 61b are vertically moved by a screw mechanism including the slag moving shafts 64a and 64b and the sliding member 63.

Three slits 53a are formed in the inner conductor 53 to extend along the longitudinal direction thereof and arranged at regular intervals circumferentially. The sliding member 63 has three protrusions 63a provided at regular intervals so as to correspond to the slits 53a. The sliding member 63 is fitted into the slags 61a and 61b in a state where the protrusions 63a are brought into contact with the inner circumference of the slags 61a and 61b. The outer circumferential surface of the sliding member 63 comes into contact with the inner circumferential surface of the inner conductor 53 without a gap therebetween. The sliding member 63 vertically slides along the inner conductor 53 by the rotation of the slag moving shaft 64a or 64b. In other words, the inner circumferential surface of the inner conductor 53 functions as a slide guide of the slags 61a and 61b.

As for a resin material of the sliding member 63, it is suitable to use a relatively easily processable resin having high slidable property, e.g., polyphenylene sulfide (PPS) resin.

The slag moving shafts 64a and 64b extend through the reflecting plate 58 to the slag driving unit 70. A bearing (not shown) is provided between the reflecting plate 58 and each of the slag moving shafts 64a and 64b. Further, a bottom plate 67 made of a conductor is provided at a lower end of the inner conductor 53. The lower ends of the slag moving shafts 64a and 64b are normally free ends so that vibration during operation can be absorbed, and the bottom plate 67 is separated from the lower ends of the slag moving shafts 64a and 64b by about 2 mm to 5 mm. The bottom plate 67 may be configured as a bearing unit and the lower ends of the slag moving shafts 64a and 64b may be supported by the bearing unit.

The slag driving unit 70 includes a housing 71, and the slag moving shafts 64a and 64b extend into the housing 71. Gears 72a and 72b are installed at upper ends of the slag moving shafts 64a and 64h. The slag driving unit 70 includes a motor 73a for rotating the slag moving shaft 64a, and a motor 73b for rotating the slag moving shaft 64b. A gear 74a is attached to a shaft of the motor 73a, and a gear 74b is attached to a shaft of the motor 73b. The gear 74a is engaged with the gear 72a, and the gear 74b is engaged with the gear 72b. Accordingly, the slag moving shaft 64a is rotated by the motor 73a through the gears 74a and 72a, and the slag moving shaft 64b is rotated by the motor 73b through the gears 74b and 72b. The motors 73a and 73b are, e.g., stepping motors.

The slag moving shaft 64b is longer than the slag moving shaft 64a and extends further upward than the slag moving shaft 64a. Therefore, the gears 72a and 72b are vertically offset from each other, and the motors 73a and 73b are also vertically offset from each other. Accordingly, the footprint of the power transmission mechanism including the motors, the gears and the like is reduced, and the housing 71 has the same diameter as that of the outer conductor 52.

Incremental encoders 75a and 75b for detecting the positions of the slags 61a and 61b are provided on the motors 73a and 73b so as to be directly coupled to output shafts thereof, respectively.

The positions of the slags 61a and 61b are controlled by a slag controller 68. Specifically, the slag controller 68 sends control signals to the motors 73a and 73b based on an impedance of an input terminal detected by an impedance detector (not shown) and position information of the slags 61a and 61b detected by the encoders 75a and 75b. The impedance is adjusted by controlling the positions of the slags 61a and 61b. The slag controller 68 performs impedance matching such that an impedance of electrical termination becomes, e.g., 50Ω. When only one of the two slags is moved, a trajectory of the impedance passes through the origin of the smith chart. When both of the two slags are moved at the same time, only the phase of the impedance is rotated.

The antenna section 45 includes: a planar slot antenna 81 serving as a microwave emission antenna and having slots 131; a wave retardation member 82 provided on the top surface of the planar slot antenna 81; and the dielectric member 110b of the ceiling plate 110 provided at a leading end of the planar slot antenna 81. A columnar member 82a made of a conductor is provided to extend through the center of the wave retardation member 82 and connects the bottom plate 67 and the planar slot antenna 81. Accordingly, the inner conductor 53 is connected to the planar slot antenna 81 through the bottom plate 67 and the columnar member 82a. The lower end of the outer conductor 52 extends to the planar slot antenna 81, and the wave retardation member 82 is covered by the outer conductor 52. Further, the planar slot antenna 81 is covered by a coating conductor 84.

The wave retardation member 82 and the dielectric member 110b have a dielectric constant greater than vacuum, and are made of quartz, ceramic, a fluorine-based resin such as polytetrafluoroetylene or the like, or a polyimide-based resin. The wave retardation member 82 and the dielectric member 110b make the wavelength of the microwave shorter than a long wavelength of the microwave in the vacuum, so that the size of the antenna can be reduced. The wave retardation member 82 can adjust the phase of the microwave by the thickness of the wave retardation member 82. The thickness of the wave retardation member 82 is adjusted such that an antinode of the standing wave is formed at a contact portion between the ceiling plate 110 and the planar slot antenna 81. Accordingly, the radiation energy of the planar slot antenna 81 can be maximized while minimizing the reflection.

The ceiling plate 110 is formed by inserting the dielectric members 110b into the frame 110a. Each of the dielectric members 110b is provided in contact with the corresponding planar slot antenna 81. The microwave amplified by the main amplifier 48 passes through the waveguide 44 between the inner conductor 53 and the outer conductor 52, and then reaches the antenna section 45. In the antenna section 45, the microwave penetrates, as a surface wave, through the wave retardation member 82, and is transmitted through the slots 131 of the planar slot antenna 81. Further, the microwave penetrates through the dielectric member 110b of the ceiling plate 110 and, is transmitted along the surface of the dielectric member 110b that is in contact with the plasma. By this surface wave, a surface wave plasma is generated in the space within the chamber 1.

The thickness of the planar slot antenna 81 (the thickness of the slot 131) is determined such that the length of the closed circuit C along which the surface current and the displacement current of the antenna section 45 shown in FIG. 7 flow becomes $n\lambda_0 \pm \delta$ (n being a positive integer, $\delta$ being a fine-tuning component (including 0)) when the wavelength of the microwave is $\lambda_0$. The value of $\delta$ is determined to be, e.g., about 25 mm or less, such that a sufficient surface current is obtained. For example, when the frequency is 860 MHz, $\lambda_0$ is approximately 349 mm. Therefore, when n is 1, a central value of the length of the closed circuit C is about 350 mm, and an optimal thickness of the slot 131 is determined by the length.

As shown in FIG. 8, the planar slot antenna 81 is formed, e.g., in a circular plate shape (planar shape) as a whole, and six slots 131 are arranged in a circumferential shape as a whole. The slots 131 have the same shape each other which is elongated along the circumference. At a joint portion of the adjacent slots 131, an end portion of one slot 131 which is positioned at an outer side overlaps with an end portion of another slot 131 which is positioned at an inner side. In other words, the central portion of each slot 131 connects one end portion thereof at the outer side and the other end portion thereof at the inner side and in a circular ring-shaped region 132 indicated by dashed double-dotted lines where the six slots 131 are included, the central portion of each slot 131 connects obliquely the one end portion which is in contact with the outer circumference of the region 132 and the other end portion which is in contact with the inner circumference of the region 132. Further, the joint portions between the slots are covered by the slots in the circumferential direction, and a portion where no slot is formed does not exist in the circumferential direction.

The slots 131 have a length of $(\lambda g/2) - \delta'$. Here, $\lambda g$ represents an effective wavelength of a microwave, and $\delta'$ represents a fine-tuning component (including 0) that is finely tuned such that uniformity of an electromagnetic field intensity is increased in the circumferential direction (angular direction). The length of the slot 131 is not limited to about $\lambda g/2$, and may be obtained by subtracting the fine-tuning component (including 0) from an integer multiple of $\lambda g/2$. The central portion of the slot 131 and the opposite end portions thereof (overlapped portions) have substantially the same length. In other words, the central portion has a length of $(\lambda g/6) - \delta_1$, and the opposite end portions thereof have lengths of $(\lambda g/6) - \delta_2$ and $(\lambda g/6) - \delta_3$, respectively. Here, $\delta_1$, $\delta_2$ and $\delta_3$ are fine-tuning components (including 0) that are finely tuned such that the uniformity of the electromagnetic field intensity is increased in the circumferential direction (angular direction). Since the overlapped portions of the adjacent slots preferably have the same length, $\delta_2$ is preferably equal to $\delta_3$. In the present embodiment, a length of one slot 131 is about $\lambda g/2$, so that a total length of six slots is about $3\delta g$. The length of the overlapped portions is $(\lambda g/6) \times 6 = \lambda g$, so that the circumferential length becomes about $2\lambda g$. Therefore, the antenna is substantially equivalent to a conventional antenna in which four slots, each having a length of about $\lambda g/2$, are arranged in a circumferential shape. The slots 131 are arranged such that the inner circumferences thereof are spaced from the center of the planar slot antenna 81 by a distance of about $(\lambda g/4) \pm \delta''$. Here, $\delta''$ represents a fine-tuning component (including 0) that is finely tuned to obtain uniform distribution of the electromagnetic field intensity in a diametrical direction. The distance from the center of the planar slot antenna 81 to the inner circumferences of the slots is not limited to about $\lambda g/4$ and may be obtained by adding the fine-tuning component (including 0) to an integer multiple of $\lambda g/4$.

The planar slot antenna 81 can prevent the electromagnetic wave intensity at joint portions between slots from being decreased and thus can improve the uniformity of the plasma in the circumferential direction (angular direction).

The number of slots is not limited to six. The same effect can be obtained even when the number of slots is three to five or seven or more. Further, the shape of the slots of the planar slot antenna 81 is not limited to the shape shown in FIG. 8. For example, a plurality of circular arc-shaped slots may be uniformly arranged on a circumference.

In the present embodiment, the main amplifier 48, the tuner 60, and the planar slot antenna 81 are arranged close to one another. The tuner 60 and the planar slot antenna 81 form a lumped constant circuit existing within a ½ wavelength. Further, a combined resistance of the planar slot antenna 81, the wave retardation member 82, and the dielectric member 110*b* is set to 50Ω. Therefore, the tuner 60 can directly tune the plasma load, and the energy can be efficiently transferred to the plasma.

The slot 131 may be filled with a dielectric material. By filling the slot 131 with the dielectric material, the effective wavelength of the microwave is shortened. Hence, the entire thickness of the slot (the thickness of the planar slot antenna 81) can be reduced.

The respective components of the surface wave plasma processing apparatus 100 are controlled by a control unit 120 having a microprocessor. The control unit 120 includes a storage unit, an input unit, a display and the like. The storage unit stores therein process sequences of the surface wave plasma processing apparatus 100 and processing recipes as control parameters. The control unit 120 controls the plasma processing apparatus in accordance with a selected processing recipe.

(Operation of Surface Wave Plasma Processing Apparatus)

Hereinafter, an operation of the surface wave plasma processing apparatus 100 configured as described above will be described.

First, a wafer W is loaded into the chamber 1 and mounted on the susceptor 11. Next, a microwave is transmitted into the chamber 1 from the microwave plasma source 2 while introducing a plasma gas, e.g., Ar gas, into the chamber 1 from the plasma gas supply source 27 through the line 28 and the plasma gas introducing member 26. Accordingly, the surface wave plasma is generated.

Then, a processing gas, e.g., an etching gas such as $Cl_2$ gas or the like, is injected into the chamber 1 from the processing gas supply source 25 through the line 24 and the shower plate 20. The injected processing gas is excited into a plasma by the plasma that has passed through the spaces 23 of the shower plate 20. The plasma process, e.g., the etching process is performed on the wafer W by the plasma of the processing gas.

In order to generate the surface wave plasma, in the microwave plasma source 2, the microwave power oscillated by the microwave oscillator 32 of the microwave output unit 30 is amplified by the amplifier 33, and the amplified microwave power is divided into a plurality of microwave powers by the divider 34. Then, the divided microwave powers are guided to the microwave supply unit 40. In the microwave supply unit 40, the divided microwave power is individually amplified by the main amplifier 48 forming the solid state amplifier and supplied into the waveguide 44 of the microwave emission mechanism 43. Thereafter, the microwave power reaches the antenna section 45. In the antenna section 45, the microwave penetrates, as a surface wave, through the wave retardation member 82 and is transmitted through the slots 131 of the planar slot antenna 81. Further, the microwave penetrates through the dielectric member 110*b* of the ceiling plate 110 and is transmitted through the surface of the dielectric member 110*b* which is in contact with the plasma. By this surface wave, the surface wave plasma is generated within the chamber 1.

In general, the slot antenna is known as a microwave emission unit. In a basic emission method of the slot antenna, it is known that an emission efficiency is maximized when a longitudinal length of the slot is set to a sum of an integer multiple of a half of the effective wavelength of the microwave and δ' (δ' being a fine-tuning component (including 0)). In the case of emitting the microwave into the air, the length of the slot may become shorter than a cutoff wavelength in a certain antenna structure, and the microwave is attenuated as the slot antenna is made thicker. Accordingly, it is important to minimize the thickness of the slot antenna. For example, in the case of using a planar slot antenna covered with quartz and setting the length of the slot to 30.5 mm (a half of the effective wavelength of the microwave of 2.45 GHz), a TE10 wave is transmitted in the slot. Therefore, when the slot serves as a waveguide, the cutoff wavelength is 61 mm and the microwave of 2.45 GHz is attenuated and cannot be transmitted. In order to minimize this attenuation, it is important to reduce the thickness of the slot serving as a waveguide. Therefore, conventionally, the thickness of the slot is reduced to about 1 mm, even in the case of the planar slot antenna 81 of the present embodiment.

Figure 9:
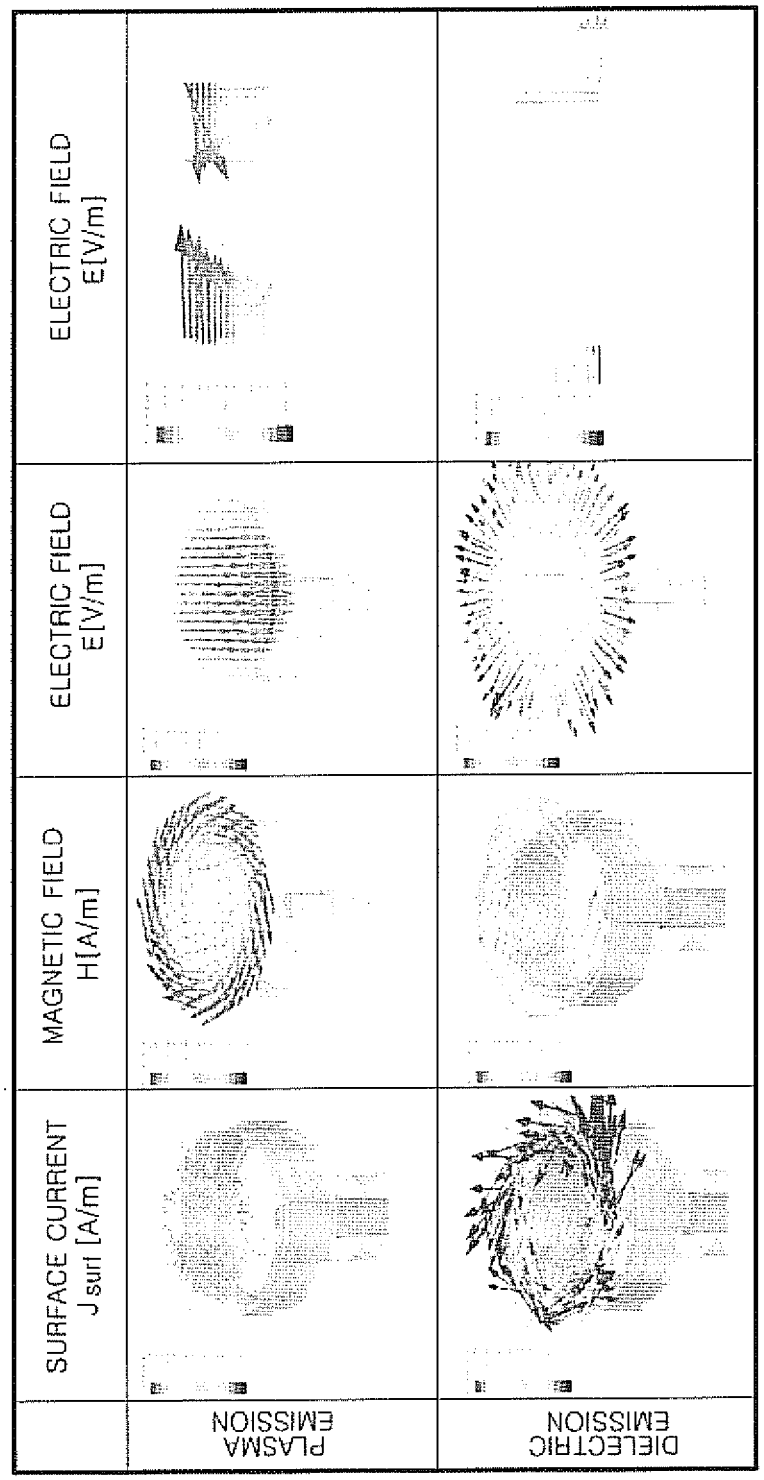
FIG. 9 shows results of simulations on electromagnetic field characteristics in microwave emission into a plasma and a dielectric member.

However, the case of emitting the microwave into the plasma has a different aspect from the case of emitting the microwave into a dielectric such as the air. FIG. 9 shows results of simulations on the electromagnetic field characteristics in the cases of emitting the microwave into the plasma and the dielectric. When there is no external fixed magnetic field and a driving frequency is greater than a collision frequency between electrons and neutral particles, the dielectric constant of the plasma can be approximately represented by the following equation.

$$K_p = 1 - \frac{\omega_{pe}^2}{\omega^2} \quad \text{(Eq. 1)}$$

Here, ω indicates the frequency of the microwave, and $\omega_{pe}$ indicates a vibration frequency of the electrons in the plasma.

The wave number of the electromagnetic wave in the plasma is indicated by the following equation. Therefore, it is clear that when $K_p$ is a negative value, the electromagnetic wave cannot propagate through the plasma, i.e., the electromagnetic wave is totally reflected.

$$K = \pm \frac{\sqrt{K_p}}{c} \omega \quad \text{(Eq. 2)}$$

It is considered that the heating of the plasma (power absorption) is caused by resonance of the electron plasma wave generated near the total reflection surface and the electromagnetic wave emitted through the slots. In a region having a strong electric field and very close to a position where the electromagnetic wave is emitted, the electrons in the plasma have a higher thermal energy. In that state, a wave generated by energy exchange of the thermal energy and the electric field energy may exist. Such a wave has an electric field component parallel to a travel direction (longitudinal wave), which is referred to as an electron plasma wave. One to the resonance of the electron plasma wave and the electromagnetic wave emitted through the slots, the electron plasma wave can absorb the power at a maximum efficiency. The energy of the electron plasma wave is converted to the electron energy by Landau damping and the electrons can obtain the energy efficiently. When the driving frequency is lower than the collision frequency between neutral particles and electrons, the energy transfer of the emitted electromagnetic wave to the electrons is carried out by an evanescent wave emitted into the plasma by dielectric loss. On the interface between the plasma and the dielectric member 110b, an electric field component exists, though it is small, due to the presence of the plasma dielectric loss, i.e., due to a resistance component. However, since it is considered to be a shorted terminal in the microwave circuit, a vertical component mainly acts. The surface current on the interface between the plasma and the dielectric member 110b flows in the diametrical direction, unlike the case of emitting the microwave into the dielectric member, and forms a closed circuit with the inlets of the slots 131 (including the wave retardation member 82). The current flowing in the closed circuit includes a surface current and a displacement current. The current flowing on the metal surface is the surface current, and the current flowing in the dielectric member is the displacement current. Specifically, as shown in FIG. 7, there is formed a closed circuit C in which a current penetrates through the wave retardation member 82 to reach the slot 131 of the planar slot antenna 81, flows along the inner wall of the slot 131 of the planar slot antenna 81, penetrates through the dielectric member 110b, flows on the interface the surface of the dielectric member 110b) between the plasma and the dielectric member 110b from an outer side toward the center thereof, penetrates through the dielectric member 110b at the center thereof, flows on the interface between the dielectric member 110b and the planar slot antenna 81 to reach the slot 131, flows along the inner wall of the slot 131, and then penetrates through the wave retardation member 82. In other words, when the microwave is emitted into the plasma, the inside of the slots functions not as a transmission path but as a part of the antenna. Therefore, unlike the case of emitting the microwave into the dielectric member such as the air, it is unnecessary to minimize the thickness of the slot. The closed circuit includes the plasma surface, and this greatly contributes to the energy transfer into the plasma. Hence, it is important to maximize the flow of the surface current to the closed circuit in order to improve the energy transfer efficiency to the plasma. The surface current of the closed circuit is maximized when the electric field thereof is approximately an integer multiple of the wavelength $\lambda_0$ of the microwave (resonance condition). However, even if the electric field of the closed circuit is slightly deviated from the integer multiple of the wavelength $\lambda_0$ of the microwave, the surface current can be increased. Accordingly, in the present embodiment, the thickness of the slot 131 (i.e., the thickness of the planar slot antenna 81) is defined such that the length of the closed circuit becomes $n\lambda_0 \pm \delta$ (n being a positive integer, $\delta$ being a fine-tuning component (including 0)). As described above, the value of $\delta$ is determined to obtain a sufficient surface current, which is about 25 mm or less. For example, when the frequency f is 860 MHz, $\lambda_0$ is approximately 349 mm. Therefore, if n equals to 1, the central value of the length of the closed circuit C is about 350 mm and a preferable length of the closed circuit C is 350 mm±25 mm. When the central value is about 350 mm, the thickness of the slot 131 is about 30 mm. As described above, when the microwave is emitted into the plasma, the thickness of the slot 131 may be thick as such.

In a state where the impedance is matched after the plasma is ignited, the input microwave power is classified into a power absorbed by the plasma and a power absorbed by other components (the wall surface of the chamber 1, the surface of the planar slot antenna 81, and the dielectric member). It is important to increase a ratio of the power absorbed by the plasma in order to improve the electron generation efficiency. In the present embodiment, as described above, the surface current can be increased and the energy transfer efficiency is high, i.e., the plasma absorption efficiency is high. Therefore, the electron generation efficiency is high and the electron density increasing rate can be increased when the input power is increased. Further, this can reduce the power absorbed by other components than the plasma and suppress the temperature increase of the planar slot antenna 81 and the chamber 1.

In the present embodiment, unlike the conventional knowledge in which the thickness of the slot 131 (i.e., the thickness of the slot antenna) is preferable as thin as possible, the increasing rate of the plasma density can be increased by setting the length of the closed circuit to $n\lambda_0 \pm \delta$ regardless of the thickness of the slot 131 when the input power is increased. If the wave retardation member 82 and the dielectric member 110b made of a dielectric material such as quartz becomes thicker, various modes occur and the plasma becomes unstable. Further, the plasma ignition becomes difficult and the plasma itself cannot be generated. However, in the present embodiment, in order to prevent such problems, the length of the closed circuit is set to $n\lambda_0 \pm \delta$ by relatively increasing the thickness of the slot 131 while relatively decreasing the thicknesses of the wave retardation member 82 and the dielectric member 110b.

Figure 10:
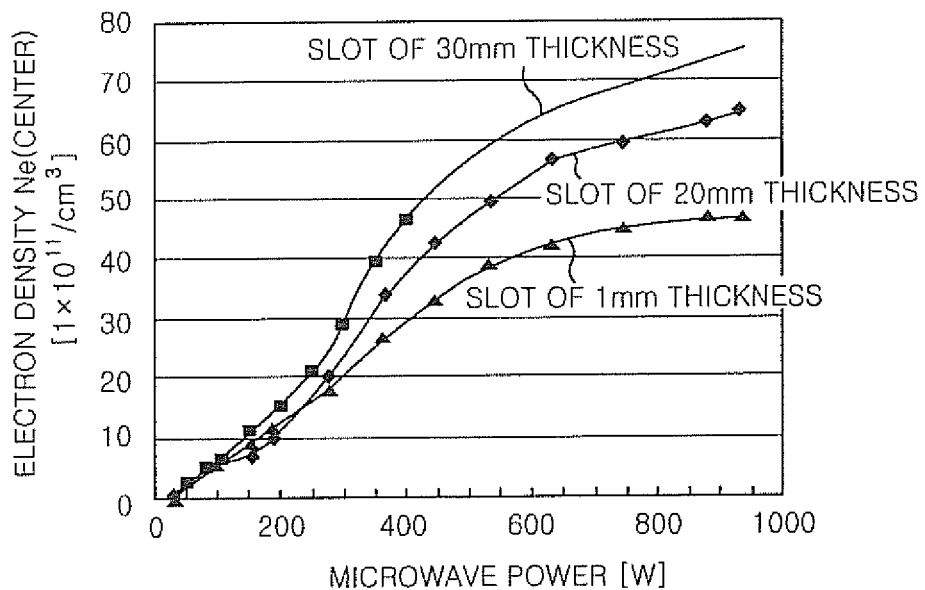
FIG. 10 shows relationship between an electron density and a microwave power in the cases of setting a thickness of the slot of the planar slot antenna to 30 mm, 20 mm and 1 mm.

Next, the electron density was measured in the case of generating a plasma while varying a microwave power at a microwave frequency of 860 MHz, by using a microwave emission mechanism in which the thickness of the slot of the planar slot antenna is set to 1 mm, 20 mm and 30 mm. The result thereof is shown in FIG. 10. In a conventional case in which the thickness of the slot is 1 mm, the length of the closed circuit C is about 294 mm. In the case where the thickness of the slot is 20 mm, the length of the closed circuit C is about 332 mm. In the case where the thickness of the slot is 30 mm, the length of the closed circuit C is about 352 mm. At the frequency of 860 MHz, $\lambda_0$ is approximately 349 mm. Therefore, the length of the closed circuit C satisfies $\lambda_0 \pm \delta$ in both of the cases where the thickness of the slot is 20 mm and where the thickness of the slot is 30 mm. Further, in the case where the thickness of the slot is 30 mm, the length of the closed circuit C is further close to the resonance condition (the length of the closed circuit C=$\lambda_0$). Accordingly, as shown in FIG. 10, the increasing rate of the electron density can be more increased in the cases where the thickness of the slot is 20 mm and 30 mm having the length of the closed circuit C satisfying $n\lambda_0 \pm \delta$, than in the case where the thickness of the slot is 1 mm. Further, the increasing rate of the electron density can be further increased in the case where the thickness of the slot is 30 mm than in the case where the thickness of the slot is 20 mm.

Figure 11:
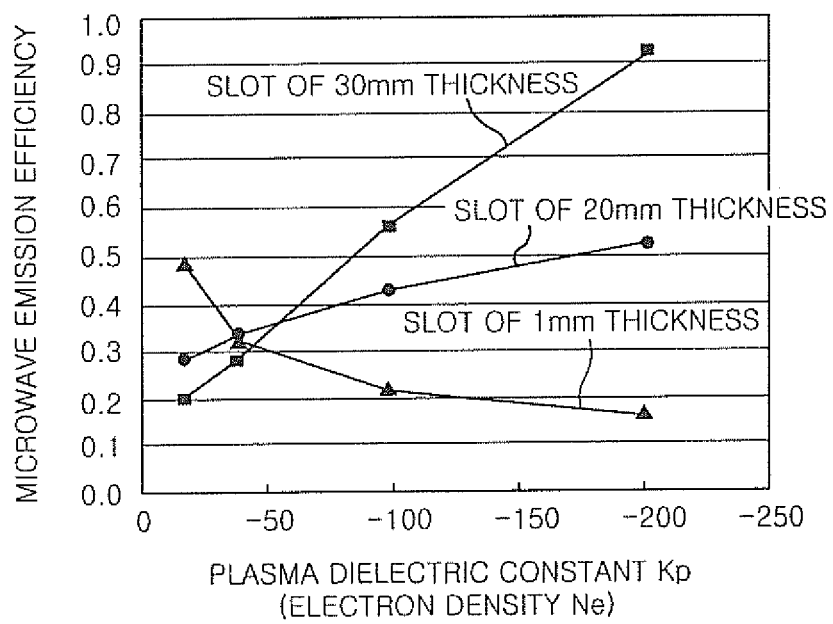
FIG. 11 shows relationship between a dielectric constant of a plasma and a microwave emission efficiency in the cases of setting a thickness of the slot of the planar slot antenna to 30 mm, 20 mm and 1 mm.

FIG. 11 shows relationship between a dielectric constant Kp of the plasma which corresponds to the electron density and the microwave emission efficiency. In the case where the thickness of the slot is 1 mm, the emission efficiency is slightly decreased as an absolute value of the relative dielectric constant of the plasma, i.e., the electron density is increased. However, in the case where the thickness of the slot is 20 mm, the emission efficiency is increased, and in the case where the thickness of the slot is 30 mm, the emission efficiency is further increased as the electron density is increased.

As described above, in the present embodiment, the antenna section includes: the antenna having slots through which the microwave is emitted; the dielectric member through which the microwave emitted from the antenna is transmitted, a surface wave being formed on a surface of the dielectric member; and the closed circuit, in which a surface current and a displacement current flow, including inner walls of the slots and the surface and the inner portion of the dielectric member. Further, when the wavelength of the microwave is $\lambda_0$, the length of the closed circuit is set to $n\lambda_0 \pm \delta$ (n being a positive integer, $\delta$ being a fine-tuning component (including 0)). Therefore, the surface current in the antenna section can be increased regardless of the thickness of the slot. Further, since the absorption efficiency of the plasma is high, the electron density increasing rate can be increased in the case of increasing an input power.

(Other Application)

The present invention is not limited to the above embodiments and may be variously modified within the scope of the present invention. For example, the configurations of the microwave output unit 30, the microwave supply unit and the like are not limited to those of the above embodiments. For example, the phase shifter may not be provided when it is unnecessary to control the directivity of the microwave emitted from the antenna or to form a circular polarized wave. Further, the wave retardation member 82 is not necessary in the microwave emission mechanism 43.

Although an example in which a plurality of microwave emission mechanisms is provided has been described in the above embodiments, a single microwave emission mechanism may be provided.

In the above embodiments, an etching apparatus has been described as an example of a plasma processing apparatus. However, the present invention is not limited thereto, and may be applied to another plasma processing apparatus for performing film formation, oxynitride film processing, ashing, or the like. Further, the substrate to be processed is not limited to the semiconductor wafer W, and may be another substrate such as a flat panel display (FPD) substrate represented by a liquid crystal display (LCD) substrate, a ceramic substrate or the like.

DESCRIPTION OF REFERENCE NUMERALS

1: chamber
2: microwave plasma source
11: susceptor
12: supporting member
15: gas exhaust line
16: gas exhaust unit
17: loading/unloading port
20: shower plate
30: microwave output unit
31: microwave power supply
32: microwave oscillator
40: microwave supply unit
41: antenna module
42: amplifier unit
43: microwave emission mechanism
44: waveguide
45: antenna section
52: outer conductor
53: inner conductor
54: power supply mechanism
55: microwave power introduction port
56: coaxial cable
58: reflecting plate
60: tuner
81: planar slot antenna
82: wave retardation member
100: surface wave plasma processing apparatus
110: ceiling plate
110b: dielectric member
120: control unit
131: slot
C: closed circuit
W: semiconductor wafer

What is claimed is:

1. A microwave emission mechanism for emitting into a chamber a microwave generated by a microwave generation mechanism, in a plasma processing apparatus for performing plasma processing by generating a surface wave plasma in the chamber, the microwave emission mechanism comprising:
a transmission path through which the microwave is transmitted, the transmission path comprising a cylindrical outer conductor and an inner conductor coaxially disposed within the outer conductor; and
an antenna section configured to emit into the chamber the microwave transmitted through the transmission path,
wherein the antenna section comprises: an antenna having a slot through which the microwave is emitted; and a dielectric member through which the microwave emitted from the antenna is transmitted, a surface wave being formed on a surface of the dielectric member;
wherein a closed circuit is operable to form with current flowing in an inner wall of the slot and the dielectric member, wherein the current comprises surface current and displacement current, and
wherein, when a wavelength of the microwave is $\lambda_0$, a length of the closed circuit is configured to equal $n\lambda_0 \pm \delta$, wherein n is a positive integer and $\delta$ is a fine-tuning component including 0, wherein the length of the closed circuit is based on a height of the slot, a thickness of the dielectric member, and a lateral distance between the slot and the dielectric member.

2. The microwave emission mechanism of claim 1, wherein the height of the slot corresponds to a thickness of the antenna and is determined such that the length of the closed circuit is $n\lambda_0 \pm \delta$.

3. The microwave emission mechanism of claim 1, wherein the slot is filled with a solid dielectric material.

4. A microwave plasma source, comprising:
a microwave generation mechanism configured to generate a microwave; and
a microwave emission mechanism configured to emit the generated microwave into a chamber,
wherein the microwave is emitted into the chamber to generate a surface wave plasma of a gas supplied into the chamber,
wherein the microwave emission mechanism comprises:
a transmission path through which the microwave is transmitted, the transmission path comprising a cylindrical outer conductor and an inner conductor coaxially disposed within the outer conductor; and
an antenna section configured to emit into the chamber the microwave transmitted through the transmission path,
wherein the antenna section comprises: an antenna having a slot through which the microwave is emitted; and a dielectric member through which the microwave emitted from the antenna is transmitted, a surface wave being formed on a surface of the dielectric member;

wherein a closed circuit is operable to form with current flowing in an inner wall of the slot, and the dielectric member, wherein the current comprises surface current and displacement current, and wherein when a wavelength of the microwave is $\lambda_0$, a length of the closed circuit is configured to equal $n\lambda_0 \pm \delta$, wherein n is a positive integer and $\delta$ is a fine-tuning component including 0, wherein the length of the closed circuit is based on a height of the slot, a thickness of the dielectric member, and a lateral distance between the slot and the dielectric member.

5. The microwave plasma source of claim 4, wherein the microwave emission mechanism is provided in plural numbers.

6. The microwave plasma source of claim 4, wherein in the microwave emission mechanism, the height of the slot is determined such that the length of the closed circuit becomes $n\lambda_0 \pm \delta$.

7. The microwave plasma source of claim 4, wherein the slot of the microwave emission mechanism is filled with a solid dielectric material.

8. A surface wave plasma processing apparatus, comprising;
a chamber configured to accommodate a substrate to be processed;
a gas supply unit configured to supply a gas into the chamber; and
a microwave plasma source configured to emit a microwave into the chamber to generate a surface wave plasma of the gas supplied into the chamber, the microwave plasma source comprising a microwave generation mechanism for generating the microwave and a microwave emission mechanism for emitting the generated microwave into the chamber,
wherein the substrate in the chamber is processed by the surface wave plasma,
wherein the microwave emission mechanism comprises:
a transmission path through which the microwave is transmitted, the transmission path comprising a cylindrical outer conductor and an inner conductor coaxially disposed within the outer conductor; and
an antenna section configured to emit into the chamber the microwave transmitted through the transmission path,
wherein the antenna section comprises: an antenna having a slot through which the microwave is emitted; and a dielectric member through which the microwave emitted from the antenna is transmitted, a surface wave being formed on a surface of the dielectric member;

wherein a closed circuit is operable to form current flowing in an inner wall of the slot and the dielectric member, wherein the current comprises a surface current and a displacement current, and wherein when a wavelength of the microwave is $\lambda_0$, a length of the closed circuit is configured to equal $n\lambda_0 \pm \delta$, wherein n is a positive integer and $\delta$ is a fine-tuning value comprising 0, wherein the length of the closed circuit is based on a height of the slot, a thickness of the dielectric member, and a lateral distance between the slot and the dielectric member.

9. The surface wave plasma processing apparatus of claim 8, wherein the microwave plasma source comprises a plurality of microwave emission mechanisms.

10. The surface wave plasma processing apparatus of claim 8, wherein in the microwave emission mechanism, the thickness of the slot is in the range of 20~35 mm.

11. The surface wave plasma processing apparatus of claim 8, wherein the slot of the microwave emission mechanism is filled with a solid dielectric material.

12. The microwave emission mechanism of claim 1, wherein the height of the slot is in the range of 20~35 mm.

13. The microwave emission mechanism of claim 1, wherein the antenna section further comprises a wave retardation member, the current flowing in the inner wall of the slot and the dielectric member further flows in the wave retardation member, and the length of the closed circuit is further determined based on a thickness of the wave retardation member.

14. The microwave plasma source of claim 4, wherein the antenna section further comprises a wave retardation member, the current flowing in the inner wall of the slot and the dielectric member further flows in the wave retardation member, and the length of the closed circuit is further determined based on a thickness of the wave retardation member.

15. The surface wave plasma processing apparatus of claim 8, wherein the antenna section further comprises a wave retardation member, the current flowing in the inner wall of the slot and the dielectric member further flows in the wave retardation member, and the length of the closed circuit is determined based on a thickness of the wave retardation member.

* * * * *